United States Patent [19]

Shiloh et al.

[11] Patent Number: 4,596,325
[45] Date of Patent: Jun. 24, 1986

[54] ADJUSTABLE LOOSE AND CARDED COMPONENT FEEDER

[76] Inventors: Adam Shiloh, 3517 Glen Way, Huntingdon Valley, Pa. 19006; Peretz J. Shiloh, 534 A Knights Bridge; Avraham Shiloh, 127 Thunder Cir., both of Bensalem, Pa. 19020

[21] Appl. No.: 557,858

[22] Filed: Dec. 5, 1983

[51] Int. Cl.⁴ .............................................. B65G 37/00
[52] U.S. Cl. .................. 198/463.4; 198/532
[58] Field of Search ............... 198/491, 771, 477, 400, 198/396, 389, 540, 532, 653, 399, 391, 690, 381, 463.4; 193/27, 40; 221/38

[56] References Cited

U.S. PATENT DOCUMENTS

| | | | |
|---|---|---|---|
| 396,297 | 1/1889 | Schofield | 193/27 |
| 1,457,562 | 6/1923 | Thomas | 198/530 |
| 3,115,235 | 12/1963 | Othon | 198/399 |
| 3,831,736 | 8/1974 | Barnes | 198/690 |
| 4,360,095 | 11/1982 | Baldwin et al. | 193/40 |

OTHER PUBLICATIONS

Heller four page brochure, entitled "System 116a Quickly Cuts and Forms Axial Leads".
The Eraser Company, Inc., two page brochure entitled "Wybar Lead Forming Division".
Roto Form Sales Corp., four page brochure entitled "Roto II/Roto-Trim".
General Production Devices, four page brochure entitled "CF-7", CF-8.

*Primary Examiner*—Joseph E. Valenza
*Assistant Examiner*—D. Glenn Dayoan
*Attorney, Agent, or Firm*—Steele, Gould & Fried

[57] ABSTRACT

An adjustable electrical component feeder is disclosed which includes adjustable blades for controlling the gravity movement of the components, as feed wheel receiving the components from the adjustable blades, and an adjustable stop assembly positioned to be contacted by the component leads as the components exit from the adjustable blades, the stop assembly including an adjustable finger adapted to limit the space available to receive component leads between feed wheel teeth so that the leads of only a single electronic component can be fed at one time to the space between adjacent feed wheel teeth.

6 Claims, 7 Drawing Figures

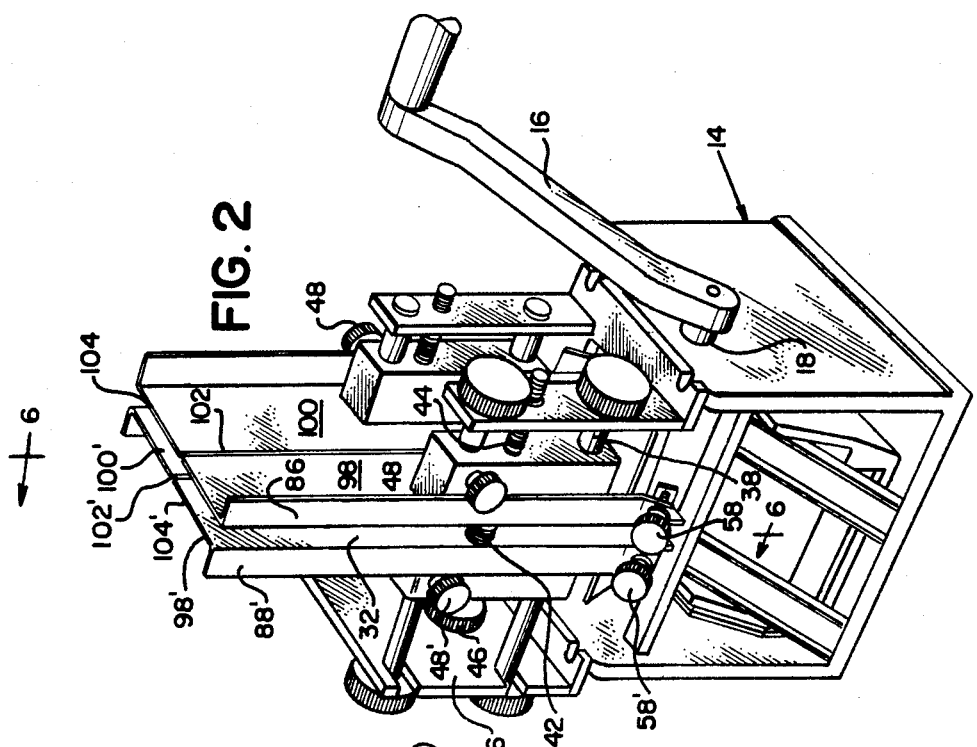
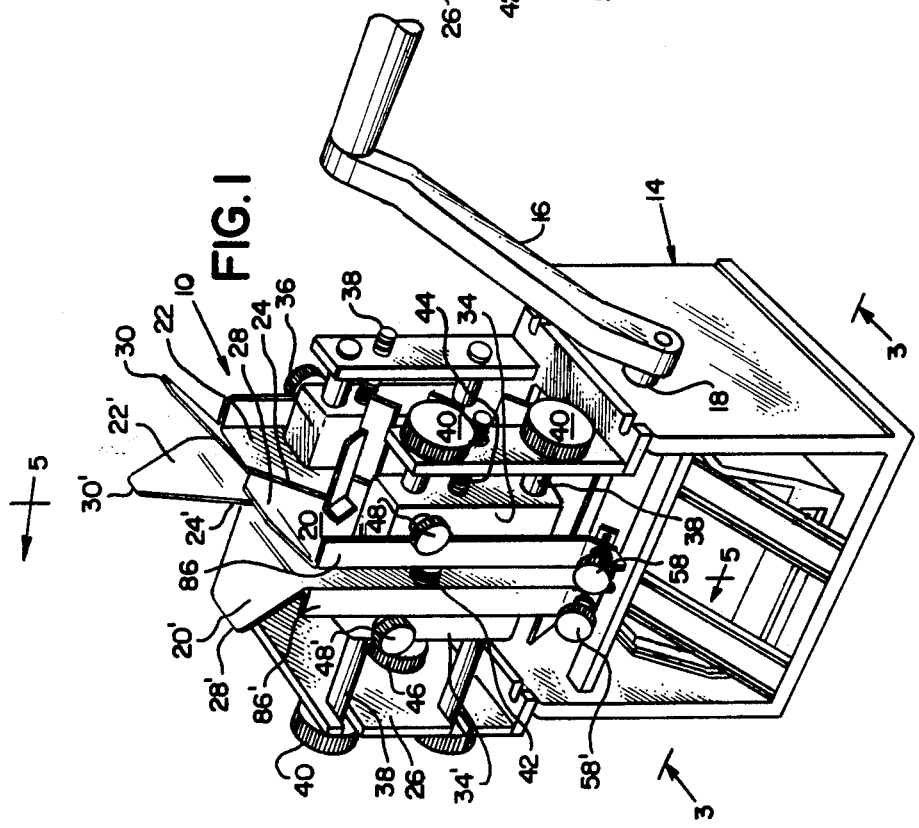

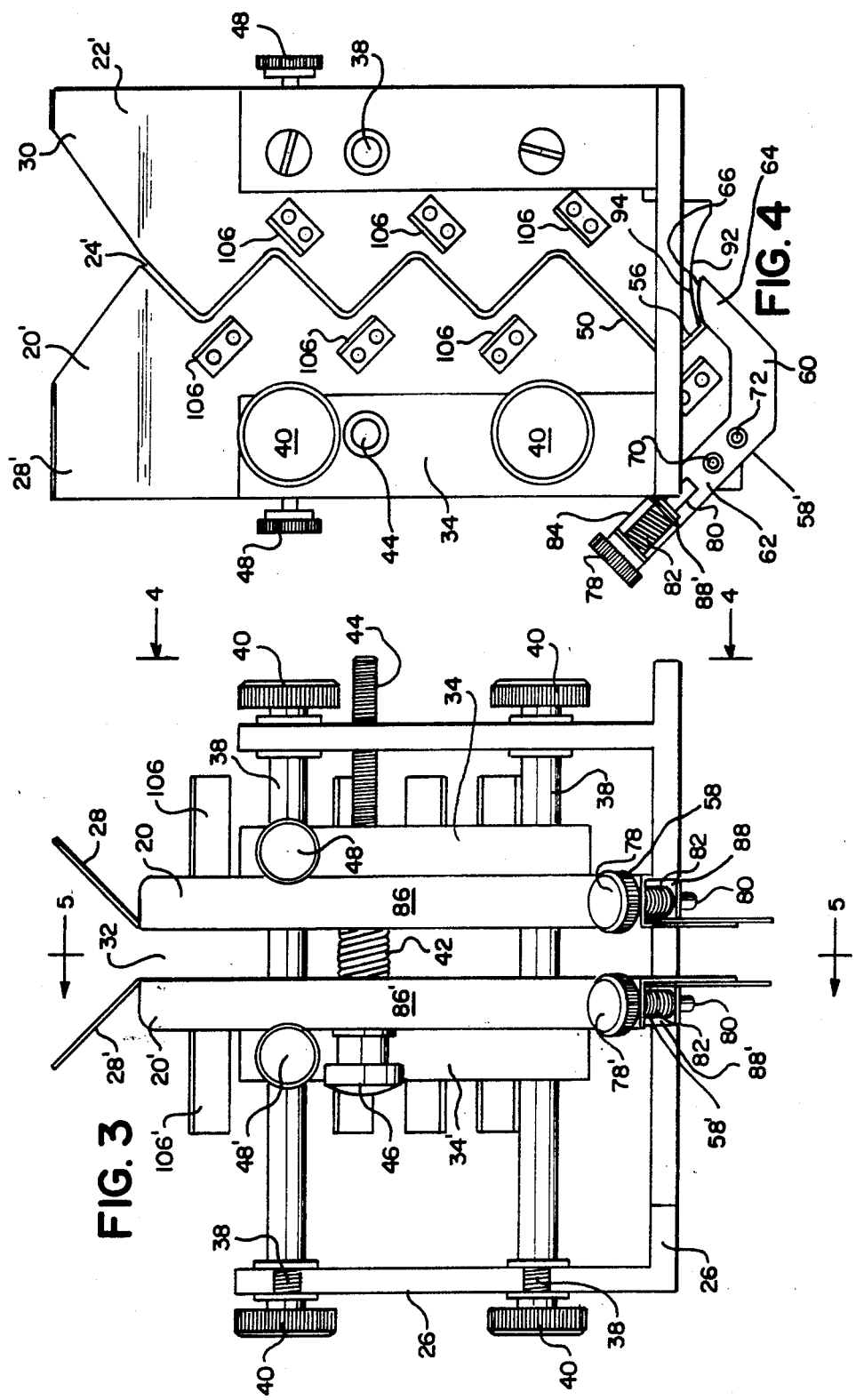

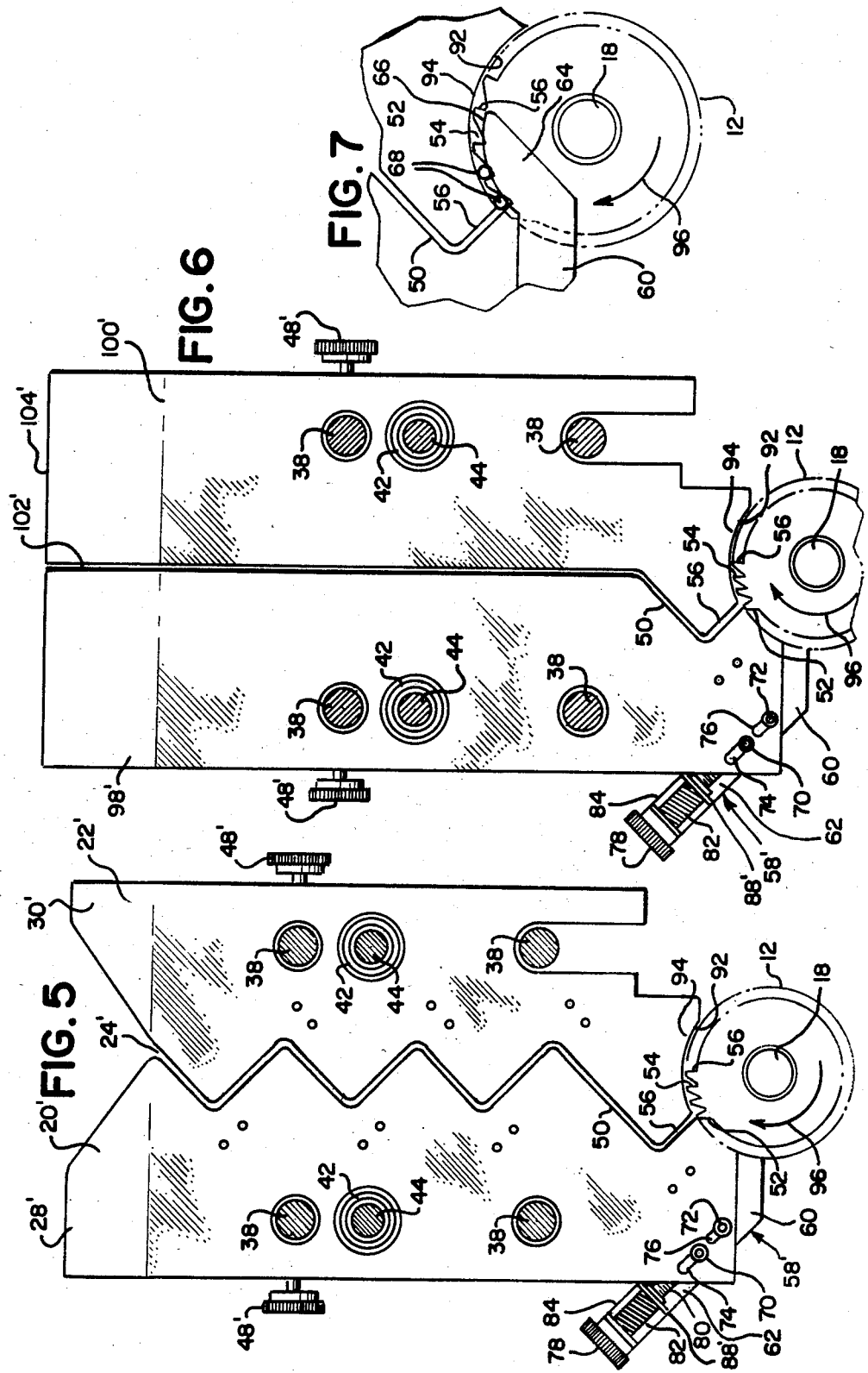

ADJUSTABLE LOOSE AND CARDED COMPONENT FEEDER

FIELD OF THE INVENTION

The present invention relates generally to the field of electronic equipment construction, and more particularly, is directed to a device adapted to uniformly feed both loose and carded electronic components to a component forming machine for trimming and bending therewithin.

BACKGROUND OF THE INVENTION

In the field of electronic equipment construction, numerous types of components such as resistors and capacitors are utilized in the circuitry as required by the circuit design criteria. These components are produced by the manufacturer with long leads and can be supplied in either loose or carded arrangement to the electronic equipment manufacturer. The loose or carded resistors, capacitors, etc., as delivered with the elongated lead wires must be cut or trimmed to proper size and then bent or formed prior to soldering or otherwise being electrically connected into the circuitry. Electronic equipment manfacturers generally standardize designs and manufacturing techniques for mass production purposes to thereby increase efficiency and reduce production costs. One common practice to increase efficiency is to uniformly trim and form the component lead wires prior to delivery to the equipment production line. In this manner, the time and energy of each production worker can be concentrated on the equipment assembly without any slowdown for cutting and bending the component leads. In answer to this need, prior workers in the art have been attempting to develop machines that are capable of substantially automatic, continuous, uniform operation to trim and bend component leads to the precise design requirements.

The prior workers in the art have experienced increasing difficulties in uniformly and individually feeding the components to the feed wheels of known type trimming and forming machines in view of the increasing use of smaller and smaller components with correspondingly small lead diameters. The problem could not be solved simply by reducing the tooth size on the feed wheel to accommodate such relatively small diameter leads one at a time because such tooth construction would render the device unusable with larger components when so required. When attempting to use presently available equipment for trimming and bending the leads of smaller components, it was found that quite often the lead wire diameter was smaller than the height of the feed wheel teeth. Because of this, frequently the lead wires of two or even three components might be urged into the same trough or space between adjacent feed wheel teeth, thereby rotatively driving the two or three components at the same time to cause a machine jam.

Because of three circumstances, to date the need remains to provide a component feeder having suitable adjustment means to be capable of always feeding only one component per tooth as the feed wheel is turned in order to accommodate all conventional, commonly employed components, both large and small.

SUMMARY OF THE INVENTION

The present invention relates generally to the field of electrical component feeders, and more particularly, is directed to a loose and carded component feeder that includes adjustment means to accomodate both larger and smaller components as they are fed in turn to the feed wheel of a lead trimming device.

The present invention incorporates spaced pairs of front and rear blades to facilitate feeding components to the ratchet feed wheel of a conventional component trimming and forming machine. In one configuration, the blades define a zig-zag path therebetween for feeding loose components. In a complementary configuration, the blades define a straight, vertical path for feeding carded components to the feed wheel. In either configuration, the component feeder of the present invention is readily mounted upon a component lead trimmer and former of known design for cooperating feeding operation therewith.

The pairs of front and rear blades of the instant feeder are transversely adjustable to accommodate component bodies of varying lengths in known manner. The blades define therebetween component flow paths to feed either loose components in a zig-zag path or carded components in a vertical path to a trimming device feed wheel. Both the zig-zag flow path and the straight, vertical flow path between the front and rear blades terminate downwardly in an angular exit path, which exit path is positioned at approximately forty-five degrees from the horizontal and is in substantial radial alignment with the feed wheel. In this manner, the forces of gravity are utilized to maintain the leads in a precise feed path and to prevent jamming at or about the top of the feed wheel teeth.

The front blades are each respectively provided with an adjustable bottom guide, each guide having a fine adjustment screw which is provided to define an adjustable stop surface for the leads as they proceed along the exit path. The guides, when properly adjusted, function to maintain the lead wires individually near the tops of adjacent ratchet teeth in a manner that assures that only one wire can be fed to a single trough between circularly adjacent teeth as the feed wheel is rotated. The bottom adjustable guides prevent the component leads from dropping too far into the spaces defined between circularly adjacent feed wheel teeth, thereby positively allowing only one component to be fed to each tooth.

Preferably, the rearward blades terminate downwardly in an arcuate surface or bottom curve, which curve, in cooperation with the fine adjustment mechanism including the bottom guide on the forward blades assures that the component leads will be fed in a manner whereby only a single lead can enter the space defined between adjacent feed wheel teeth.

It is therefore an object of the present invention to provide an improved adjustable loose and carded component feeder of the type set forth.

It is another object of the present invention to provide an adjustable loose and carded component feeder that includes spaced pairs of forward and rearward blades, the blades defining therebetween a zig-zag component feed path for feeding loose components.

It is another object of the present invention to provide a novel adjustable loose and carded component feeder that comprises front and rear blades in spaced relationship, the front and rear blades defining a straight feed path for feeding carded components.

It is another object of the present invention to provide a novel adjustable loose and carded component feeder wherein the feeder comprises spaced pairs of front and rear blades, the blades defining a component feed path therebetween to feed components individually to a feed wheel, the front and rear blades defining an exit feed path at the feed wheel that is oriented at substantially forty-five degrees from the horizontal.

It is another object of the present invention to provide a novel adjustable loose and carded component feeder comprising spaced pairs of front and rear blades, the front and rear blades defining a component feed path therebetween and bottom adjustment means associated with the front blades to provide an adjustable stop surface to maintain the component leads in troughs between adjacent teeth near the tops of the teeth of a trimming machine ratchet feed wheel.

It is another object of the present invention to provide a novel adjustable loose and carded component feeder comprising blade means defining a component feed path therebetween, the feed path terminating downwardly in a forty-five degree angular exit path, and adjustment means adjacent the exit path to control the individual feed of components to the feed wheel of a component lead trimming and forming machine.

It is another object of the present invention to provide an adjustable loose and card component feeder that is rugged in construction, easily adjustable to accommodate various sized components, and troublefree when in use.

Other objects and a fuller understanding of the invention will be had by referring to the following description and claims of a preferred embodiment thereof, taken in conjunction with the accompanying drawings, wherein like reference characters refer to similar parts throughout the several views, and in which:

BRIEF DESCRIPTION OF THE DRAWINGS

FIG. 1 is a perspective view of an adjustable loose and carded component feeder constructed in accordance with the present invention having blades suitable for feeding loose components.

FIG. 2 is a perspective view of a feeder similar to FIG. 1, showing a blade embodiment suitable for feeding carded components.

FIG. 3 is a partial, side elevational view of a feeder looking from line 3—3 on FIG. 1.

FIG. 4 is an end elevational view looking from line 4—4 on FIG. 3.

FIG. 5 is a cross-sectional view taken along line 5—5 on FIG. 1, looking in the direction of the arrows.

FIG. 6 is a cross-sectional view taken along line 6—6 on FIG. 2, looking in the direction of the arrows.

FIG. 7 is an enlarged, detailed view showing the bottom adjustable stop.

DETAILED DESCRIPTION OF THE PREFERRED EMBODIMENT

Although specific terms are used in the following description for the sake of clarity, these terms are intended to refer only to the particular structure of the invention selected for illustration in the drawings, and are not intended to define or limit the scope of the invention.

Referring now to the drawings, there is illustrated in FIG. 1 an adjustable component feeder 10 that is particularly designed and adapted to feed loose components (not illustrated) to the ratchet feed wheel 12 of a known type of component lead wire trimming device 14. In known manner, the ratchet feed wheel 12 may be manually rotated by a hand crank 16 as illustrated, or optionally, the feed wheel shaft 18 may be rotated by an electric motor in known manner. As illustrated, the frame 26 of the feeder 10 can be readily bolted or otherwise affixed to the trimmer 14.

The adjustable component feeder 10 comprises a pair of similar left blades 20, 20' and cooperating right blades 22, 22' for aligning and orienting loose components for feeding to the trimming device 14. The pairs of left and right blades 20, 22 and 20', 22' define respectively therebetween transversely aligned zig-zag slots or paths 24, 24' for receiving the lead wires 68 of loose components (not shown) and for feeding the components by gravity, one at a time, to the ratchet feed wheel 12 for trimming and forming in known manner. The left and right blades terminate upwardly in bent, generally triangularly shaped guides 28, 28', 30, 30' to facilitate loading in a rapid and accurate manner. A plurality of flow guides 106 are affixed to the faces of the blades 20, 20', 22, 22' in known manner to assist in the component orientation and feed.

The pairs of left and right blades 20, 22 and 20', 22' are trasversely adjustable within the frame members 26 to define a vertical adjustable with flow path 32 to receive, center and vertically stack the bodies of the loose components in an orderly manner as the components feed by gravity to the trimming device 14 through the zig-zag slot or path 24, 24'. It will be appreciated that the components to be fed (not illustrated) are produced in a variety of sizes depending upon such variables as the type of component, the rated capacity, variations between manufacturers, etc. Accordingly, means are provided to transversely adjust the width of the vertical flow path 32 to accomodate the differing dimensions of the components and to make the feeder 10 substantially universally adaptable and adjustable to handle the widest variety of components.

As illustrated, the left and right blades 20, 20', 22, 22' are respectively mounted on adjusting blocks 34, 34', 36, 36', which blocks are arranged for transverse adjustment in the frame 26 by employing a plurality of threaded similar spindles 38 with outwardly accessible adjusting knobs 40 in well-known manner. Compression springs 42, mounted upon threaded spindles 44, are positioned within the vertical flow path 32 in a manner to normally bias the pairs of left blades 20, 20' and right blades 22, 22' apart to facilitate adjustment. An adjusting knob 46 affixes at one end of each compression spring spindle to facilitate adjustment in known manner.

The adjustable feeder is also provided with front-to-back adjustment means 48, 48' which means function to permit limited front-to-rear adjustment of the pairs of left blades 20, 20' relative to the pairs of right blades 22, 22' whereby the width of the zig-zag slots 24, 24' can be varied. Thus, should the lead wires 68 of a component (not shown) be of relatively large diameter, then the adjustment means 48, 48' can be adjusted as necessary to widen the zig-zag paths 24, 24' to accommodate the diameter of the component lead. Similarly, should the component leads be of relatively fine diameter, then by utilizing the front-to-rear adjustment means 48, 48', the pairs of left and right blades 20, 20', 22, 22' can be moved closer together to thereby provide zig-zag slots 24, 24' of smaller dimensions to control the gravity flow of the smaller diameter components. Thus, it is seen that means are incorporated within the feeder construction to vary the width of the vertical flow path which is defined between the pairs of left and right blades and also to easily vary the width of the vertically oriented zig-zag paths or slots 24, 24', which are defined between the blades. In this manner, components of varying dimensions can be handled within the same device with little down time required to change from one size component to another.

As best seen in FIG. 5, the vertical paths defined by the aligned pairs of zig-zag slots 24, 24' terminate downwardly in an inclined bottom feed path 50, which path is preferably oriented at forty-five degrees from the horizontal. The bottom feed path serves to orient the components as they are fed and organized within the zig-zag slots 24, 24' to orderly arrange the components for precise adjustment as the components are fed individually to the teeth 52 of the bottom positioned ratchet feed wheel 12. As above stated, it is essential that the component leads 68 be fed one at a time into each space 54 defined between circularly adjacent ratchet wheel teeth 52 whereby the components can be transported one at a time through a trimming device 14 for trimming and forming in the desired manner. The adjustable feeder must be so designed and so operated as to assure that only a single component can be fed into a space 54 so that the components will be carried through the trimming device 14 individually and without jamming the device.

The inclined feed path 50 terminates downwardly in a right angular bend to lead the components into a short ratchet wheel feed path 56 in the manner illustrated. The ratchet wheel path 56 is oriented at substantially forty-five degrees from the horizontal and utilizes the force of gravity to orderly feed the components to the teeth 52 of the ratchet wheel 12. The short feed path 56 terminates at the outer periphery of the ratchet wheel teeth 52 whereby the teeth can pick up and rotatably move the components individually as they exit the lower feed path 56 under the forces of gravity.

In order to prevent more than one component from entering the space 54 between adjacent ratchet wheel teeth 52, bottom adjustable stop assemblies 58, 58' have been provided. As shown, a pair of similar, adjustable stop assemblies 58, 58' are utilized, one such assembly being associated with each left blade 20, 20'.

As best seen in FIG. 4, each adjustable stop assembly 58, 58' comprises a bent finger 60 of generally U-shaped configuration having an elongated adjustment leg 62 and an integral stop finger 64. The stop finger 64 is upwardly provided with an arcuate stop surface 66 upon which the leads 68 contact and stop against as they exit the bottom of the ratchet wheel feed path 56. The arcuate stop surface 66 is movable substantially radially of the ratchet feed wheel teeth 52 to adjust the available spacing 54 between adjacent feed wheel teeth at the tops thereof for receipt therein of individual component leads 68. By radially adjusting the position of the stop finger 64, the device can be adjusted to assure that the available space 54 between adjacent teeth 52 will be limited to permit only a single component lead to enter, thereby assuring sequential feed without jamming.

The adjustment leg 62 includes a pair of adjustment pins 70, 72 which are designed to ride within the respective elongated openings 74, 76 provided on the left blades 20, 20' to facilitate radial movement of the arcuate stop surface 66 relative to the outer periphery of the ratchet wheel teeth 52. The elongated slots 74, 76 are oriented at substantially forty-five degrees from the horizontal to thereby move the arcuate stop surface 66 in a path that is substantially normal to the orientation of the bottom feed path 56. A knurled knob 78 turns an adjustment screw 80 to finely adjust the relative position of the stop finger 64 to assure single component feeding. A spring 82 is secured to bias between the adjustment housing 84 and a portion of a front blade 20, 20 in known manner to facilitate operation. In a preferred embodiment, the adjustment screw 80 may be provided with a 10-24 thread having twenty-four threads per inch. In this manner, each turn of the knob 78 through three hundred sixty degrees will provide linear movement of one twenty-fourth or an inch, an adjustment that is fine enough to permit accurate, single feeding.

Referring to FIGS. 1 and 3, each adjustment stop assembly 58, 58' may be readily easily applied to the left blades 20, 20' by terminating the blade front flanges 86, 86' downwardly in a respective inclined foot 88, 88'. In the illustrated embodiment, each foot 88, 88' is provided with a threaded opening to receive therein the threaded barrel of the adjustment screw 80 in threaded arrangement. The spring 82 biases between the top of each inclined foot 88, 88' and the bottom of the adjustment housing 84 for stop finger adjustment purposes in known manner. Accordingly, as the adjustment screw 80 is turned within its threaded opening, the adjustment leg 62 will be caused to move relative to the affixed left blade 20, 20' through interaction of the pins 70, 72 within their respective elongated openings 74, 76.

Referring to FIGS. 5, 6 and 7, it will be noted that the right blades 22, 22' terminate downwardly in respective arcuate surfaces 92, which surfaces are concentric with the arc transcribed by the outer periphery of the ratchet feed wheel teeth 52. Each arcuate surface 92 is fixed in location and has no adjustment movement relative to the ratchet feed wheel 12. It will be noted, however, that the arcuate stop surfaces 66 of the adjacent adjustable finger 60 can be moved toward or away from the fixed arcuate surface 92, thereby providing an adjustable feed path 94, which path can be adjusted to accomodate the varying thicknesses of different component leads 68. In a preferred embodiment, the curvative of the finger arcuate stop surface 66 can be developed non-concentric with the arcuate bottom surface 92 to thereby define a flow path 94 of decreasing height as the feed wheel 12 is rotated in the direction of the arrow 96 upon either hand or motor rotation of the ratchet wheel shaft 18. Accordingly, as the ratchet wheel 12 is rotated, the component leads 68 will be individually forced lower in their respective troughs between adjacent teeth until each lead bottoms in its associated trough, with single feed assured.

In the event that the components are delivered to the feeder of the present invention in carded arrangement (as is frequently the case), then modified left and right blades 98, 98', 100, 100', as illustrated in FIGS. 2 and 6, can be employed. The left blades 98, 98' and right blades 100, 100' are similar in arrangement and function to the left blades 20, 20' and right blades 22, 22' illustrated in FIGS. 1 and 5 with the exception that the respective pairs of blades define straight, vertical slots 102, 102' therebetween. Inasmuch as the components are already aligned in preparation for feeding by the manufacturer and carded in proper alignment, the leads of the carded components can be fed directly into the straight, vertical slots 102, 102' without the need for a zig-zag alignment path in the manner illustrated in FIGS. 1 and 5. It will be noted that the modified left and right blades terminate upwardly in linear top surfaces 104, 104' to facilitate feeding the carded components. In use, the carded component leads are introduced into the aligned vertical slots 102, 102' and the cardboard (not shown) can then be removed to thereby allow the components to feed by gravity directly downwardly through the slots 102, 102'.

The remaining portions of the modified left and right pairs of blades 98, 98', 100, 100' are constructed in precisely the same manner and configuration as the remaining portions of the left and right blades 20, 20', 22, 22' and accordingly, need not be further herein described in detail. Suffice it to say that the straight, vertical slots 102, 102' terminate downwardly in the same inclined bottom feed path 50 and ratchet wheel feed path 56 so that the actual feed of the components to the ratchet wheel 12 will be precisely the same for both loose and carded components. The mounting and adjustment, both laterally and front to back of the modified blades 98, 98', 100, 100' will be the same as the mounting and adjustment of the left and right blades 20, 20', 22, 22' as hereinbefore described.

In use, in the case of either loose or carded components, the proper, corresponding blades, either blades 20, 20', 22, 22', or modified blades 98, 98', 100, 100', are selected and arranged within the frame 26 in the manner illustrated in either FIG. 1 or FIG. 2. The transverse clearance space between the blades is adjusted by turning the knobs 40 to provide a proper vertical flow path 32 to accommodate the length of the component bodies being processed. Then the vertical slots, either the zigzag slots 24, 24' as illustrated in FIG. 1 and FIGS. 5, or straight vertical slots 102, 102' as illustrated in FIGS. 2 and 6 can be adjusted by turning the knobs 48, 48'. The width of the slots 24, 24' or 102, 102' should be adjusted to accommodate the actual diameter of the lead wires 68 of the components being fed to facilitate orderly gravity fall the alignment. In this manner, the components will be caused to enter the inclined bottom feed path 50 and the ratchet wheel feed path 56 in properly aligned relationship for introduction to the ratchet feed wheel 12 in sequential arrangement.

The bottomly positioned adjustable stop assemblies 58, 58' are adjusted by utilizing the adjusting knobs 78, 78' to vertically move each arcuate stop surface 66, 66' relative to the periphery of the ratchet feed wheel teeth 52 to permit only one lead wire 68 to position within a space 54 between adjacent teeth. As the ratchet wheel 12 is rotated in the direction of the arrow 96, the configuration of the arcuate stop surface 66, 66' will lower each component lead 68 in turn toward the bottom of its respective space 54.

Thus, it is seen that a completely adjustable and universally adaptable feeder is provided which can accomodate all popularly sized components, even very small components, in either loose or carded form within the same basic mechanism. In the case of loose components, the cooperating pairs of blades define a zig-zag feed path therebetween. In the case of carded components, interchangeable pairs of blades which define a vertical feed path therebetween are chosen. The blades are laterally adjusted to accommodate varying component lengths and the feed paths, whether zig-zag or vertical and are also adjustable front to rear to accommodate different diameter component leads. Bottom adjustable stop assemblies provide easy and precise component lead stop locations relative to the ratchet feed wheel teeth to assure the feeding of only a single component at a time by the ratchet feed wheel 12.

Although the invention has been described with reference to the particular embodiment herein set forth, it is understood that the present disclosure has been made only by way of example and that numerous changes in the details of construction may be resorted to without departing from the spirit and scope of the invention. Thus, the scope of the invention should not be limited by the foregoing specification, but rather only by the scope of the claims appended hereto.

What is claimed is:

1. An adjustable component feeder for feeding electronic components having bodies and leads individually to spaces between adjacent teeth is a mechanism multi-tooth feed wheel comprising
   a frame adopted to be securely affixed relative to the feed wheel;
   blade means adjustably secured on the frame to control the downward gravity movement of the components relative to the frame,
   the blade means comprising cooperating pairs of left and right blades, each pair of left and right blades defining a vertically descending slot therebetween for controlled movement of the component leads, the slot terminating downwardly in a ratchet wheel feed path; and
   adjustable stop assembly means secured to one of the said plates to stop the component leads as they downwardly exit the ratchet wheel feed path, a part of the adjustable stop assembly means being positioned to be contacted by the leads as they exit the ratchet wheel feed path,
   the stop assembly means comprising a finger portion that is adapted to be adjustably positioned relative to the ratchet wheel feed path and to the teeth of the feed wheel,
   the finger portion being adaptable to limit the space between adjacent feed wheel teeth that is available to receive therein the component leads,
   whereby the leads of only a single electronic component can be fed to the space between adjacent feed wheel teeth,
   the finger portion of the stop assembly means being adapted for radial adjustment relative to the feed wheel teeth,
   the finger portion comprising a stop surface, the stop surface being arcuately formed and having an arc that is non-concentric with the feed wheel.

2. The feeder of claim 1 wherein one of the plates of the said pair of blades bottomly defines an arcuate surface, the said arcuate surface being positioned radially outwardly from the outer periphery of the feed wheel, the arcuate surface being in concentric relationship to feed wheel.

3. The feeder of claim 2 wherein the said arcuate surface coincides with the arc transcribed by the outer periphery of the teeth of the multi-tooth feed wheel.

4. The feeder of claim 1 wherein the adjustable stop assembly means comprises an adjustment leg in spaced relationship from the finger portion, the adjustment leg being secured to one of the said blades in an adjustable, sliding interconnection.

5. The feeder of claim 4 wherein the adjustable stop assembly further comprises and adjusting screw secured for rotation within a said blade, the adjusting screw being threadly engaged with the adjustment leg to move the adjustment leg relative to the said one of the said blades when the adjusting screw is turned.

6. The feeder of claim 5 wherein the adjustable stop assembly further comprises a housing and a coil spring interposed between a portion of the housing and a portion of the blade, the spring continuously biasing the adjusting leg in one direction relative to the blade.

* * * * *